(12) United States Patent
Williams (10) Patent No.: US 7,038,507 B2
(45) Date of Patent: May 2, 2006

(54) FREQUENCY SYNTHESIZER HAVING PLL WITH AN ANALOG PHASE DETECTOR

(75) Inventor: Anthony David Williams, Aptos, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 135 days.

(21) Appl. No.: 10/713,717

(22) Filed: Nov. 14, 2003

(65) Prior Publication Data

US 2005/0104667 A1    May 19, 2005

(51) Int. Cl.
H03L 7/06    (2006.01)
(52) U.S. Cl. .......................................... 327/156; 331/12
(58) Field of Classification Search .................. 331/12, 331/17, 25; 327/154, 155, 156, 164; 375/375, 375/376, 373
See application file for complete search history.

(56) References Cited

U.S. PATENT DOCUMENTS

| 5,910,753 | A * | 6/1999 | Bogdan ........................ 331/17 |
| 6,359,476 | B1 * | 3/2002 | Hartman et al. ............. 327/106 |
| 6,404,291 | B1 * | 6/2002 | Riley ............................ 331/11 |
| 6,441,692 | B1 | 8/2002 | Nakatani et al. ............. 331/142 |
| 6,515,525 | B1 | 2/2003 | Hasegawa .................... 327/156 |
| 6,549,765 | B1 | 4/2003 | Welland et al. .............. 455/260 |
| 6,553,089 | B1 | 4/2003 | Huh et al. .................... 375/376 |
| 6,570,452 | B1 | 5/2003 | Sridharan .................... 331/14 |
| 6,593,783 | B1 | 7/2003 | Ichimaru ...................... 327/156 |
| 6,597,250 | B1 | 7/2003 | Jovenin ........................ 331/177 |
| 6,600,378 | B1 | 7/2003 | Patana .......................... 331/14 |
| 6,603,360 | B1 | 8/2003 | Kim et al. .................... 331/14 |
| 6,608,529 | B1 | 8/2003 | Franca-Neto ................ 331/18 |
| 6,622,010 | B1 | 9/2003 | Ichimaru ...................... 455/76 |
| 2003/0058961 | A1 * | 3/2003 | Fling et al. .................. 375/316 |
| 2004/0223575 | A1 * | 11/2004 | Meltzer et al. .............. 375/376 |

OTHER PUBLICATIONS

Analog Devices, "RF PLL Frequency Synthesizers," 2003.
Analog Devices, "400 MSPS 14-Bit, 1.8 V CMOS Direct Digital Synthesizer," 2003.

* cited by examiner

Primary Examiner—Linh My Nguyen
(74) Attorney, Agent, or Firm—Kirkpatrick & Lockhart Nicholson Graham LLP (57) ABSTRACT

A frequency synthesizer is disclosed. According to one embodiment, the frequency synthesizer includes a phase locked loop (PLL) having an analog mixer phase detector and an auxiliary digital frequency detector coupled to the phase locked loop. The PLL may include a programmable divider having an input terminal responsive to an output signal of the frequency synthesizer and having an output terminal coupled to an input terminal of the analog mixer phase detector, a loop filter having an input terminal coupled to an output terminal of the analog mixer phase detector, and a voltage controlled oscillator having a control terminal coupled to an output terminal of the loop filter. The programmable divider may include a direct digital synthesizer.

18 Claims, 6 Drawing Sheets

FREQUENCY SYNTHESIZER HAVING PLL WITH AN ANALOG PHASE DETECTOR

BACKGROUND OF THE INVENTION

The present invention is directed generally to frequency synthesizers.

Frequency synthesizers are widely used in modern radio communication systems. Such devices typically make use of a single quartz-controlled (i.e., crystal) reference oscillator combined with a phase-locked loop (PLL) to provide a multitude of output frequencies traceable to the highly stable reference from the oscillator.

Figure 1:
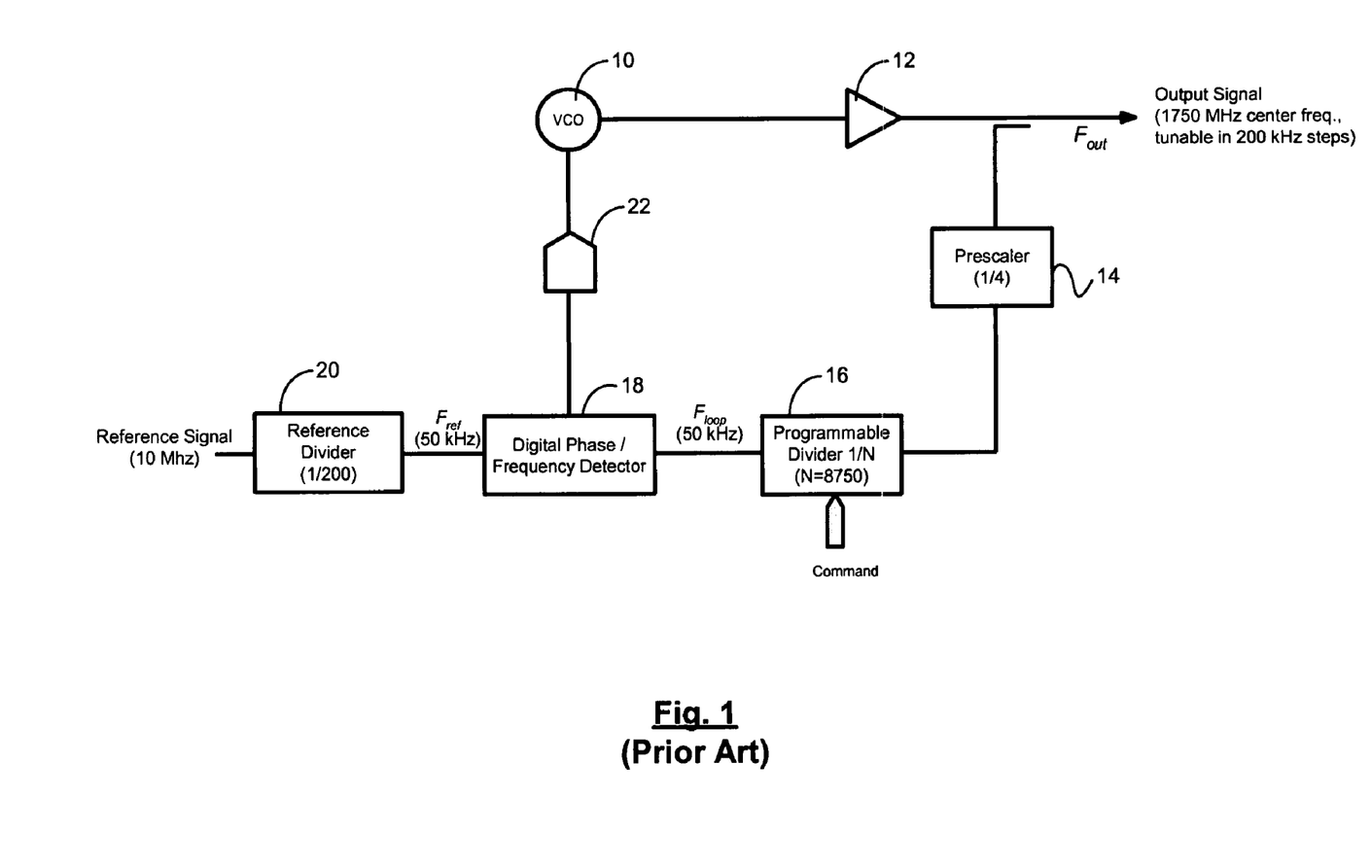
FIG. 1 is a block diagram of a conventional digital PLL frequency synthesizer.

FIG. 1 is a block diagram of a conventional digital PLL frequency synthesizer. A high frequency, tunable voltage controlled oscillator (VCO) 10 generates a signal (the "output signal") that is fed to the output port of the device via a buffer amplifier 12. A sample of the output signal is fed via a high-speed prescaler 14 (such as a fixed modulus frequency divider) and a programmable (divide by N) divider 16 to a digital phase/frequency detector 18, which is typically comprised of a pair of D-type flip-flops. The phase/frequency detector 18 also receives a reference input signal from a reference divider 20.

Error signals in the form of pulse width modulated pulse trains are produced at the output port of the phase/frequency detector 18, which are fed to an active filter 22. The active filter 22 integrates the error signals to produce a voltage control signal used to control the VCO 10. When the PLL is locked, it acts as a servo system to maintain equal frequency signals at both inputs of the phase/frequency detector 18. Therefore, the output signal frequency signal will change if the division ratio of the programmable divider 16 (which is received by the programmable divider as a command signal) is changed.

The operation of this type of Integer-N PLL frequency synthesizer may be described mathematically. In particular, $$F_{loop} = \frac{F_{out}}{PxN} \quad (1)$$

where $F_{loop}$ is the frequency of the output signal from the programmable divider 16, $F_{out}$ is the frequency of the output signal, P is the division ratio of the prescaler 14, and N is the division ratio of the programmable divider 16. The PLL acts to maintain $$F_{loop} = \frac{F_{ref}}{R} \quad (2)$$

where $F_{ref}$ is the frequency of the reference signal output from the reference divider 20 and R is the division ratio of the reference divider 20. Therefore, $$\frac{F_{ref}}{R} = \frac{F_{out}}{PxN} \quad (3)$$

and $$F_{out} = \frac{F_{ref} xPxN}{R} \quad (4)$$

Differentiating equation (4) with respect to N yields:

$$\frac{dF_{out}}{dN} = Px\frac{F_{ref}}{R} \quad (5)$$

This is the step size of the output signal or, in other words, the change in frequency in the output signal caused be changing the programmable division ratio N by one increment. Using the example frequencies and division ratios shown in FIG. 1, the phase comparison frequency may be calculated to be $$F_{loop} = \frac{1750\,\text{MHz}}{4 \times 8750} = 50\,\text{kHz}.$$

The PLL of FIG. 1 will exhibit an effective loop bandwidth determined by the time constant of the loop filter 22. Typically the loop bandwidth used in PLLs of this type is between ten and one hundred kilohertz.

The natural phase noise of the VCO 10 is suppressed at carrier-offset values less than the loop bandwidth. Phase noise performance in this region is normally limited by the so-called "phase comparator noise floor" (PCNF) of the phase/frequency detector 18. The PCNF represents the smallest difference in phase that the phase/frequency detector 18 can resolve and is normally expressed as a power level in a 1 Hz bandwidth relative to a reference carrier. The absolute PCNF of the best digital phase/frequency detectors available at this time is on the order of −213 dBc/Hz. The phase noise at the output of the PLL of FIG. 1 may be predicted mathematically to be:

$$PCNF_{output} = PCNF(\text{abs}) + 10\log_{10}F_{loop} + 20\log_{10}\left(\frac{F_{out}}{F_{comp}}\right)$$

where PCNF(abs) is the absolute PCNF. For the PLL of FIG. 1, therefore, $$PCNF_{output} = -213 + 10\log_{10}(50\times 10^3) + 20\log_{10}\left(\frac{1750\times 10^6}{50\times 10^3}\right)$$

$$PCNF_{output} \approx -75\text{dBc/Hz}$$

for an output signal center frequency of 1750 MHz.

From the above, it can be seen that the PCNF is strongly dependent on the output frequency and the step size.

With this in mind, high capacity microwave radio systems often make use of "high density modulation" schemes, such as 128 QAM (128 state Quadrature Amplitude Modulation), which require the use of low noise oscillators in both the radio transmitter and receiver. Such radio systems also typically require digital tuning of both the transmit and receive frequencies. This combination of requirements has been satisfied with the use of frequency synthesizers based on either YIG (Yttrium Iron Gamate) tuned oscillators or so-called "composite sources," formed by mixing signals from two or more oscillators. YIG synthesizers tend to be highly microphonic and produce phase hits (i.e., small but very rapid changes in the output signal frequency) when subjected to changing ambient temperature. Composite sources on the other hand are complex and tend to be expensive to produce.

Accordingly, there exists a need for a frequency synthesizer operable at high frequencies (such as microwave frequencies) that is capable of being tuned in very small frequency steps while maintaining excellent phase noise performance.

SUMMARY OF THE INVENTION

In one general respect, the present invention is directed to a frequency synthesizer. According to various embodiments, the frequency synthesizer may include a phase locked loop (PLL) having an analog mixer phase detector. In addition, the frequency synthesizer may include an auxiliary digital frequency detector coupled to the phase locked loop.

According to various implementations, the PLL may include a programmable divider having an input terminal responsive to an output signal of the frequency synthesizer and having an output terminal coupled to an input terminal of the analog mixer phase detector. The PLL may also include a loop filter having an input terminal coupled to an output terminal of the analog mixer phase detector. In addition, the PLL may include a voltage controlled oscillator (VCO) having a control terminal coupled to an output terminal of the loop filter. The programmable divider may include a direct digital synthesizer.

Additionally, the auxiliary digital frequency detector may have an input terminal coupled to the output terminal of the programmable divider via a comparator. In addition, the frequency synthesizer may include a differential integrator circuit coupled to the output of the auxiliary digital frequency detector. The output terminal of the differential integrator circuit may be coupled to a timing capacitor of the loop filter via a steering resistor. Accordingly, for various embodiments of the present invention, if the PLL is out of lock, the auxiliary digital frequency detector may detect the sense of the frequency error and thereby cause the current (referred to herein as the "steering current") to flow into or out of the loop filter timing capacitor. This, in turn will cause the voltage applied to the VCO control port to ramp up or down at a rate set by the time constant of the steering resistor and the timing capacitor. When the VCO reaches a frequency such that the output signal from the analog mixer phase detector is within the pass-band of the loop filter, the PLL will acquire and full phase lock may be achieved.

Such a frequency synthesizer may exhibit low phase noise and fine step digital tuning. Further, low microphonic commercial VCO's may be used according to various embodiments of the present invention. These and other benefits will be apparent from the detailed description to follow.

DESCRIPTION OF THE FIGURES

Embodiments of the present invention will be described by way of example in conjunction with the following figures, wherein.

DETAILED DESCRIPTION OF THE INVENTION

Figure 2:
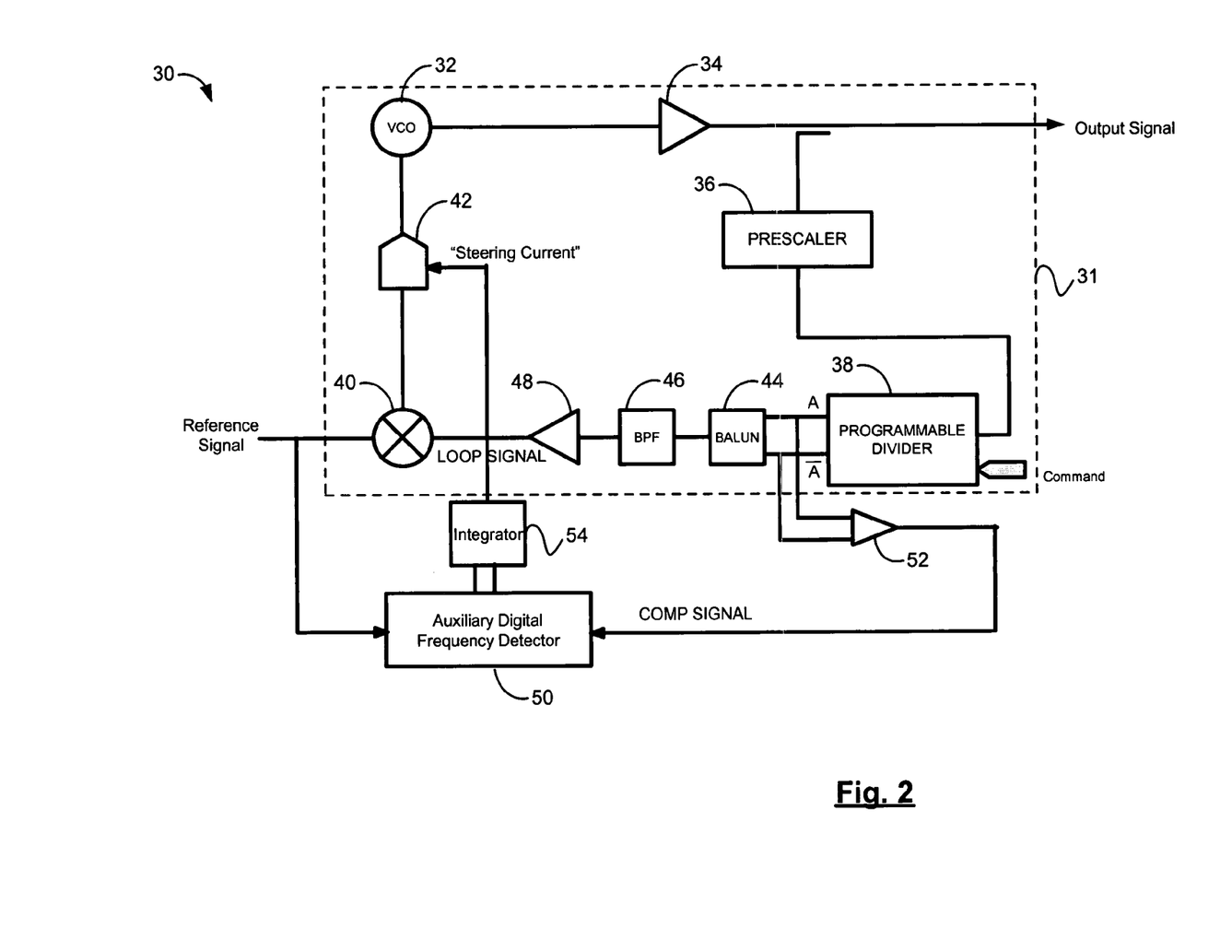
FIG. 2 is a block diagram of a frequency synthesizer according to various embodiments of the present invention.

FIG. 2 is a block diagram of a frequency synthesizer 30 according to various embodiments of the present invention. As shown in FIG. 2, the frequency synthesizer 30 includes a phase locked loop 31, comprising a voltage controlled oscillator (VCO) 32, an amplifier buffer 34, a prescaler 36, a programmable divider 38, an analog mixer 40 and a loop filter 42. The VCO 32 may produce an output signal that is fed to the amplifier buffer 34. A sample of the output signal is fed via the prescaler 36, having a prescaler division ratio P, to the programmable divider 38, whose programmable division ration N is set by a command signal from, for example, an external controller (not shown). The prescaler 36 may be, for example, a fixed modulus frequency divider.

The programmable divider 38 may output two differential signals, represented as A and $\overline{A}$ in FIG. 2. The differential outputs A and $\overline{A}$ are fed to a first input terminal of the analog mixer 40 via a series of circuit elements, including a balun transformer 44, a bandpass filter 46 and an amplifier 48, for appropriately driving the analog mixer 40. For convenience hereinafter, the output signal from the programmable divider 38 is referred to as the "loop signal."

The analog mixer 40 may act as an analog phase comparator to detect the phase difference between the loop signal and a reference signal that is fed to a second input terminal of the analog mixer 40. Hence, the analog mixer 40 is referred to hereinafter as the "analog mixer phase detector 40." If the loop signal and the reference signal have the same frequency, the output error signal of the analog mixer phase detector 40 may be a DC signal whose voltage is proportional to the phase difference between the two input signals and is zero when the two signals are in phase quadrature (i.e., 90° out of phase). The voltage of the analog mixer phase detector 40 output signal will be a maximum positive value when the two signals are in phase and a maximum negative value when the signals are in opposite phase (i.e., 180° out of phase). The error signal from the analog mixer phase detector 40 is fed to the loop filter 42, which may integrate the signal from the analog mixer phase detector 40 to thereby produce the control voltage signal for the VCO 32.

Analog phase detectors implemented as analog mixers often exhibit excellent phase noise performance. The PCNF (absolute) for such modern devices has been measured to be on the order of −230 dBc/Hz, almost 20 dB better than with digital phase detectors. Analog mixer phase detectors, however, suffer from one major drawback, which is their inability to automatically acquire phase lock when used in a conventional PLL.

In order to overcome this drawback, embodiments of the present invention, as shown in FIG. 2, may additionally include an auxiliary digital frequency detector 50. The auxiliary digital frequency detector 50 receives a first input signal, which is the output signal from a comparator 52. The comparator 52 may receive the differential outputs A and $\overline{A}$ of the programmable divider 38 at its inputs to produce a signal referred to herein for convenience as the "comp signal." The loop signal and the comp signal may have substantially the same frequency. The auxiliary digital frequency detector 50 also receives the reference signal at a second input to thereby sense the relative frequency difference between the reference signal and the comp signal.

The output pulses from the auxiliary digital frequency detector 50 are fed to a differential integrator circuit 54, which produces an output voltage, whose polarity and amplitude is proportional to the sense and magnitude, respectively, of the frequency difference between the reference signal and the comp signal, as determined by the auxiliary digital frequency detector 50. The output of the differential integrator circuit 54 may be connected to the primary timing capacitor 80 of the loop filter 42, as shown in FIG. 4, via a steering resistor 78.

If the PLL 31 is out of lock, the auxiliary digital frequency detector 50 will detect the sense of the frequency error and will thereby cause the "steering current" to flow into or out of the loop filter timing capacitor 80. This, in turn will cause the voltage applied to the VCO 32 control port to ramp up or down at a rate set by the time constant of the steering resistor 78 and the timing capacitor 80. When the VCO 32 reaches a frequency such that the output signal from the analog mixer phase detector 40 is within the pass-band of the loop filter 42, the PLL 31 will acquire and full phase lock may be achieved.

Figure 3:
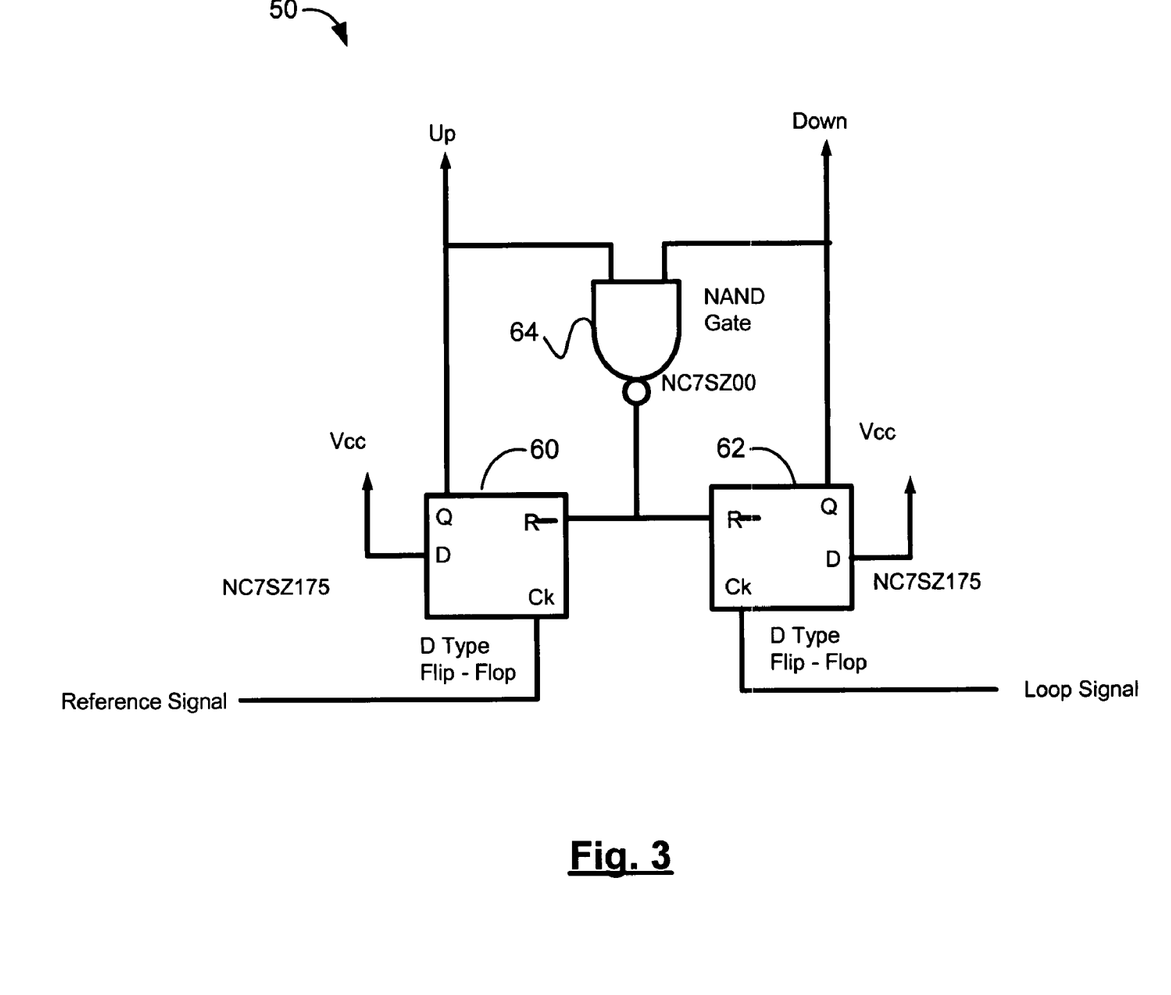
FIG. 3 is a diagram of the auxiliary digital frequency detector of the frequency synthesizer of FIG. 2 according to various embodiments of the present invention.

FIG. 3 is a diagram of the auxiliary digital frequency detector 50 according to various embodiments of the present invention. As shown in FIG. 3, the auxiliary digital frequency detector 50 may include two D-type flip-flops 60, 62. The flip-flops 60, 62 may be, for example, model NC7SZ175 flip-flops from Fairchild Semiconductor. The clock terminal ("CK") of the first flip-flop 60 may be responsive to the reference signal and the clock terminal of the second flip-flop 62 may be responsive to the comp signal from the comparator 52. The D terminals of the respective flip-flops may be held high to a logic "1" by being connected to a voltage bus (Vcc). The R-terminals of the flip-flops 60, 62 may be connected to the output terminal of a NAND gate 64. The NAND gate 64 may be, for example, a model NC7SZ00 NAND gate from Fairchild Semiconductor. The output signals from the auxiliary digital frequency detector 50, respectively shown as "Up" and "Down" in FIG. 3, may be input to the differential integrator circuit 54 and may be the outputs from the Q terminals of the respective flip-flops 60, 62. The outputs from the Q terminals may also be the inputs to the NAND gate 64, as shown in FIG. 3.

Figure 4:
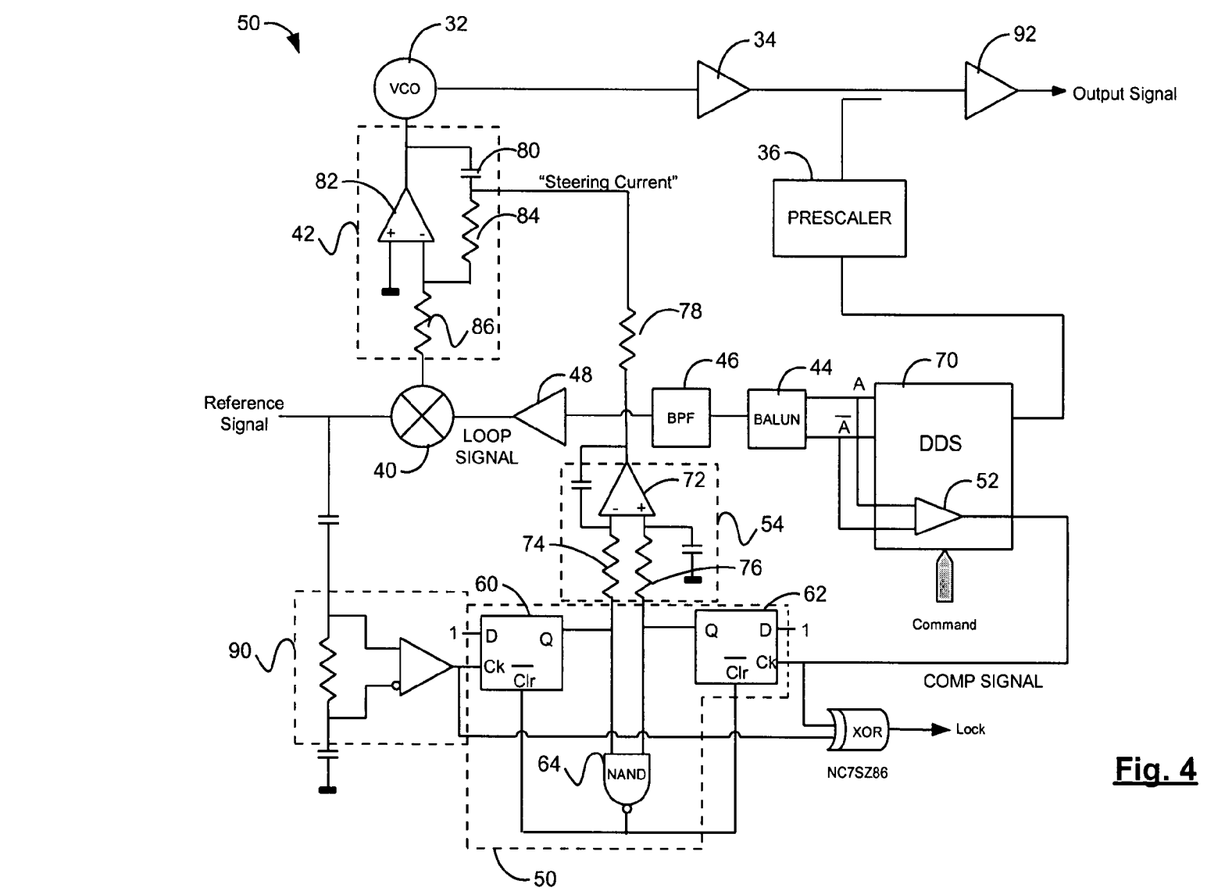
FIG. 4 is a more detailed diagram of the frequency synthesizer of FIG. 2 according to various embodiments of the present invention.

FIG. 4 is a more detailed diagram of the frequency synthesizer 30 according to various embodiments. As shown in FIG. 4, the programmable divider 38 (see FIG. 2) may be implemented as a direct digital synthesizer (DDS) 70. The DDS 70 may be a digitally programmable, complete high frequency synthesizer capable of generating a frequency-agile analog output signal sinusoidal waveform at up to 200 MHz, and may act as a fractional divider in the frequency synthesizer 30 of the present invention. As such, the DDS 70 may fractionally divide the pre-scaled output signal from the VCO 32 to generate a loop signal of a relatively high frequency, such as on the order of 50 MHz. Such a high frequency loop signal permits fine digital tuning of the output signal. According to one embodiment, the DDS 70 may be realized with a model AD9954 DDS from Analog Devices. The AD9954 DDS additionally includes a comparator. Therefore, the comparator 52 may also be realized with use of the AD9954 DDS.

Also as shown in FIG. 4, the differential integrator circuit 54 may include an operational amplifier 72 configured as an integrator, having its inverting input connected via a resistor 74 to the "up" output signal from the auxiliary digital frequency detector 50 and having its non-inverting input connected via a resistor 76 to the "down" output signal from the auxiliary digital frequency detector 50. The output signal from the differential integrator circuit 54 may be connected to the steering resistor 78. The steering resistor 78 may be connected to the primary timing capacitor 80 of the loop filter 42.

As shown in FIG. 4, the loop filter 42 may also include an operational amplifier 82 configured as an integrator. The non-inverting input terminal of the operational amplifier 82 may be connected to a constant voltage (such as ground), and the inverting input terminal may be connected to the output terminal of the analog mixer phase detector 40. The loop bandwidth for the loop filter 42 is set by the primary timing capacitor 80 and the timing resistors 84, 86. As explained previously, if the PLL 31 is out of lock, the auxiliary digital frequency detector 50 will detect the sense of the frequency error and will thereby cause the "steering current" to flow into or out of the loop filter timing capacitor 80. This, in turn will cause the voltage applied to the VCO 32 control port to ramp up or down at a rate set by the time constant of the steering resistor 78 and the timing capacitor 80. When the VCO 32 reaches a frequency such that the output signal from the analog mixer phase detector 40 is within the pass-band of the loop filter 42, the PLL 31 will acquire and full phase lock may be achieved.

As also shown in FIG. 4, the frequency synthesizer 30 may include a line receiver circuit 90 for converting the sinusoidal reference signal to a square wave for use by the auxiliary digital frequency detector 50. In addition, the frequency synthesizer 30 may include a logic gate 92 responsive to, for example, the reference signal (output from the line receiver 90) and the comp signal from the comparator 52 to thereby provide an external lock indication to other components of the radio system in which the frequency synthesizer 30 is employed. According to one embodiment, the logic gate 92 may be an XOR gate, such as a model NC7SZ86 XOR gate from Fairchild Semiconductor. In addition, as shown in FIG. 4, the frequency synthesizer may include an additional amplifier buffer 92.

Phase noise performance of an embodiment of the frequency synthesizer 30 of the present invention has been measured. For the measurements, the following parameters were used:

$F_{out}$=2300 MHz $F_{ref}$=42 MHz

Prescaler Division Ratio P=8

$F_{loop\ signal}$=$F_{comp\ signal}$=42 MHz.

Figure 5:
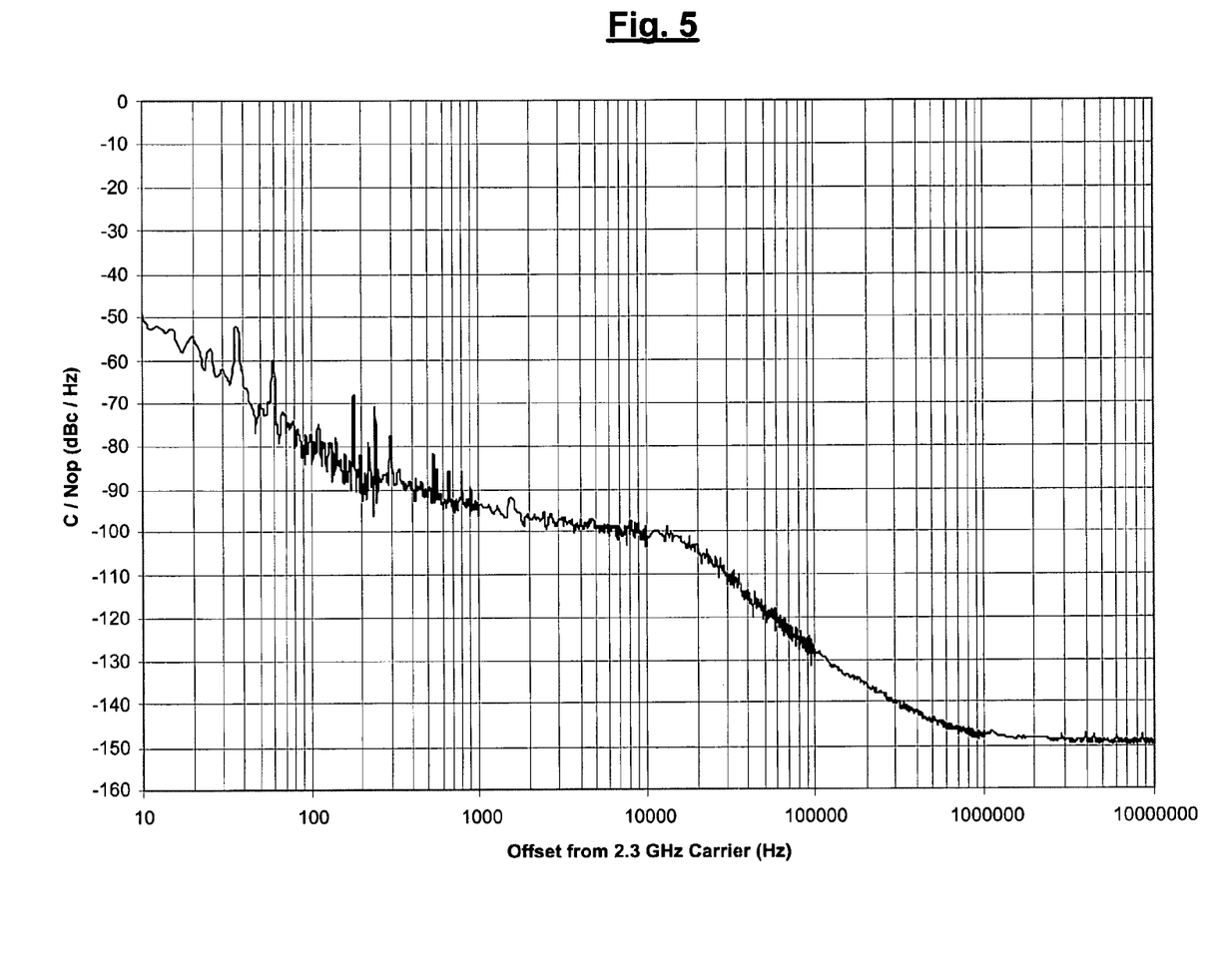
FIG. 5 is a graph showing the phase noise performance of a frequency synthesizer according to an embodiment of the present invention.
Figure 6:
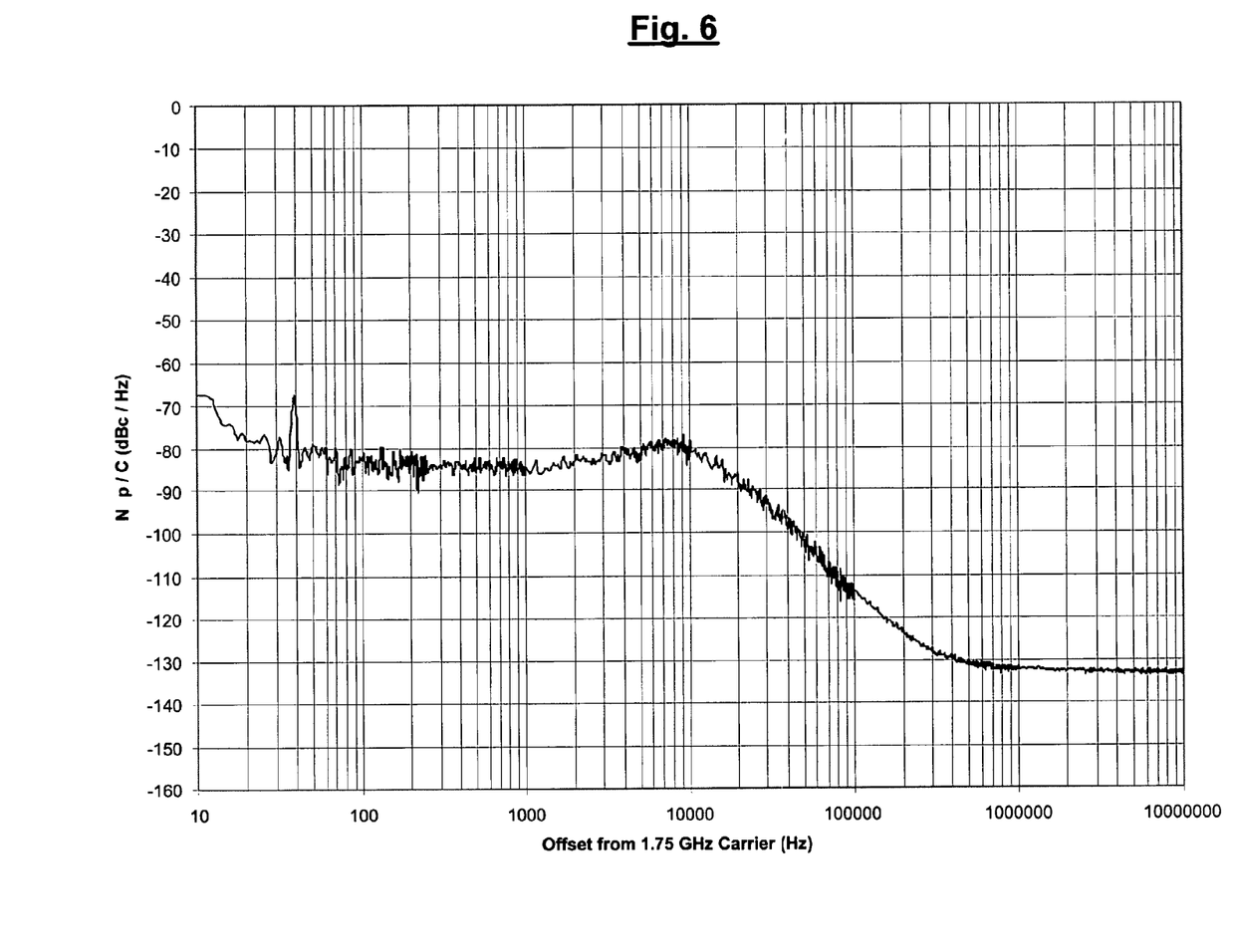
FIG. 6 is a graph of the phase noise performance of a conventional PLL frequency synthesizer.

It should be recognized that a loop signal frequency on the order of 42 MHz is significantly greater than in conventional PLL frequency synthesizers. The phase noise performance for such an embodiment is shown in FIG. 5. Notably, it can be seen in FIG. 5 that the "mid-band" phase noise in the frequency offset region between 1 kHz and 10 kHz lies between −95 and −100 dBc/Hz. The performance represents approximately a 20 dB improvement over conventional designs, as can be seen from FIG. 6, which shows the phase noise performance for a conventional PLL frequency synthesizer.

While several embodiments of the invention have been described herein, it should be apparent that various modifications, alterations and adaptations to those embodiments may occur to persons skilled in the art with the attainment of some or all of the advantages of the present invention. It is therefore intended to cover all such modifications, alterations and adaptations without departing from the scope and spirit of the present invention as defined by the appended claims.

What is claimed is:

1. A frequency synthesizer, comprising:
a phase locked loop comprising:
an analog mixer phase detector;
a programmable divider having an input terminal responsive to an output signal of the frequency synthesizer and having an output terminal coupled to an input terminal of the analog mixer phase detector;
a loop filter having a first input terminal coupled to an output terminal of the analog mixer phase detector; and
a voltage controlled oscillator having a control terminal coupled to an output terminal of the loop filter; and
an auxiliary digital frequency detector having an output terminal coupled to a second input terminal of the loop filter.

2. The frequency synthesizer of claim 1, wherein the analog mixer phase detector is for detecting a phase difference between the output signal of the programmable divider and a reference signal.

3. The frequency synthesizer of claim 1, wherein the programmable divider includes a direct digital synthesizer.

4. The frequency synthesizer of claim 1, wherein the auxiliary digital frequency detector has a first input terminal coupled to the output terminal of the programmable divider.

5. The frequency synthesizer of claim 4, further comprising a comparator coupled between the output terminal of the programmable divider and the first input terminal of the auxiliary digital frequency detector.

6. The frequency synthesizer of claim 4, further comprising a differential integrator circuit coupled between the output terminal of the auxiliary digital frequency detector and the second input terminal of the loop filter.

7. The frequency synthesizer of claim 6, wherein the second input terminal of the loop filter is coupled to a timing capacitor such that an output terminal of the differential integrator circuit is coupled to the timing capacitor of the loop filter.

8. The frequency synthesizer of claim 7, further comprising a steering resistor coupled between the output terminal of the differential integrator circuit and the timing capacitor of the loop filter.

9. The frequency synthesizer of claim 8, wherein the programmable divider includes a direct digital synthesizer.

10. The frequency synthesizer of claim 9, further comprising a comparator coupled between the output terminal of the programmable divider and the first input terminal of the auxiliary digital frequency detector.

11. The frequency synthesizer of claim 9, further comprising a prescaler responsive to the output signal of the frequency synthesizer and coupled to the input terminal of the programmable divider.

12. The frequency synthesizer of claim 9, further comprising a balun transformer coupled between the output terminal of the programmable divider and the input terminal of the analog mixer phase detector.

13. The frequency synthesizer of claim 12, further comprising a bandpass filter coupled between the balun transformer and the input terminal of the analog mixer phase detector.

14. The frequency synthesizer of claim 13, further comprising an amplifier coupled between the bandpass filter and the input terminal of the analog mixer phase detector.

15. A frequency synthesizer, comprising:
a phase locked loop comprising:
an analog mixer phase detector;
a programmable divider having an input terminal responsive to an output signal of the frequency synthesizer and having an output terminal coupled to an input terminal of the analog mixer phase detector;
a loop filter having a first input terminal coupled to an output terminal of the analog mixer phase detector; and
a voltage controlled oscillator having a control terminal coupled to an output terminal of the loop filter; and
means, coupled to a second input terminal of the loop filter, for making the analog mixer phase detector automatically acquire phase lock when the phase locked loop is out of lock.

16. The frequency synthesizer of claim 15, wherein the programmable divider includes a direct digital synthesizer.

17. In a frequency synthesizer including a voltage controlled oscillator, a loop filter, and an analog mixer phase detector, a method comprising:
adjusting the voltage applied to the voltage controlled oscillator from the loop filter until the frequency of an output signal of the analog mixer phase detector is within a pass-band of the loop filter by providing a current to a timing capacitor of the loop filter to cause the voltage supplied to the voltage controlled oscillator to change based on a time constant of the loop filter, wherein the current provided to the timing capacitor of the loop filter is provided from an integrator circuit responsive to an output signal from an auxiliary digital frequency detector whose output signal is related to a phase difference between an output signal of a programmable divider and a reference signal supplied to the auxiliary digital frequency detector, wherein the programmable divider is responsive to an output signal of the frequency synthesizer.

18. The frequency synthesizer of claim 1, wherein the auxiliary digital frequency detector is for providing a current to a timing capacitor of the loop filter to cause the voltage supplied to the voltage controlled oscillator to change based on a time constant of the loop filter.

* * * * *

UNITED STATES PATENT AND TRADEMARK OFFICE
CERTIFICATE OF CORRECTION

PATENT NO. : 7,038,507 B2 Page 1 of 1
APPLICATION NO. : 10/713717
DATED : May 2, 2006
INVENTOR(S) : Williams It is certified that error appears in the above-identified patent and that said Letters Patent is hereby corrected as shown below:

COLUMN 2

Lines 9-10, delete "caused to changing", and substitute therefor --caused by changing--.

COLUMN 2

Line 63, delete "Gamate" and substitute therefor --Garnate--.

COLUMN 4

Line 23, delete "ration N", and substitute therefor --ratio $N$--.

COLUMN 6

Line 55, delete "$F_{loop\,signal} = F_{comp} = 42$ MHz.", and substitute therefor --$F_{loop\,signal} = F_{com\,signal} = 42$ MHz.--.

Signed and Sealed this

Second Day of January, 2007

JON W. DUDAS
*Director of the United States Patent and Trademark Office*